United States Patent [19]

Ulin

[11] 3,977,494

[45] Aug. 31, 1976

[54] ADJUSTABLE SUPPORT AND HOUSING FOR A DOLL AND THE LIKE

[76] Inventor: Wylie J. Ulin, 1633 N. Kedvale Ave., Chicago, Ill. 60639

[22] Filed: May 30, 1975

[21] Appl. No.: 582,284

[52] U.S. Cl. ............................. 181/148; 181/141; 181/152; 181/155; 206/45.16
[51] Int. Cl.² ......................................... H05K 5/00
[58] Field of Search ........... 181/141, 148, 150, 163, 181/152, 156, 155; 206/45.16

[56] References Cited
UNITED STATES PATENTS

| | | |
|---|---|---|
| 2,642,948 | 6/1953 | Olson et al. ........................ 181/152 |
| 3,151,699 | 10/1964 | Peavey ............................... 181/156 |
| 3,349,661 | 10/1967 | Searls ................................ 84/94 C |
| 3,867,996 | 2/1975 | Lou .................................... 181/148 |

*Primary Examiner*—Stephen J. Tomsky
*Attorney, Agent, or Firm*—John J. Kowalik

[57] ABSTRACT

The invention relates to a housing which supports a platform for mounting a historic figure, the platform being slidable on tracks mounted in the housing and being held in adjusted positions by friction means cooperable with the track. The housing also encloses an audio system which orates a historic setting in conjunction with such period figurine which may be, for example, of a pioneer woman or early revolutionary hero suitable for the bicentennial celebration.

10 Claims, 7 Drawing Figures

3,977,494

ADJUSTABLE SUPPORT AND HOUSING FOR A DOLL AND THE LIKE

DISCUSSION OF THE PRIOR ART

Applicant knows of no similar structure which comprises a platform which mounts a display object on the platform and is positionable in vertically adjusted positions by a friction device which also centers the platform in the enclosure and also serves to cushion the object when the container is subject to abuse as during transit.

SUMMARY OF THE INVENTION

This invention appertains to a novel display device which also serves as a housing for protecting and storing a valuable art object.

A further object is to provide a novel mounting for a display item, such as a figure, in which a platform is used guided by opposing spring-actuated friction elements which stabilize the platform and permit adjusting the platform to a horizontal position.

Another object is to provide a novel cushioning mechanism which will maintain the item to be protected in spaced relation to the sides of the enclosing container.

A still further object is to provide a novel container in which an audio system is arranged to voice into an amplifying chamber which also serves as a storage area for the object-d-art which the audio system is programmed to extoll.

These and other objects and advantages inherent in and encompassed by the invention will become more readily apparent from the specification and the drawings, wherein.

DESCRIPTION OF THE INVENTION

Figure 1:
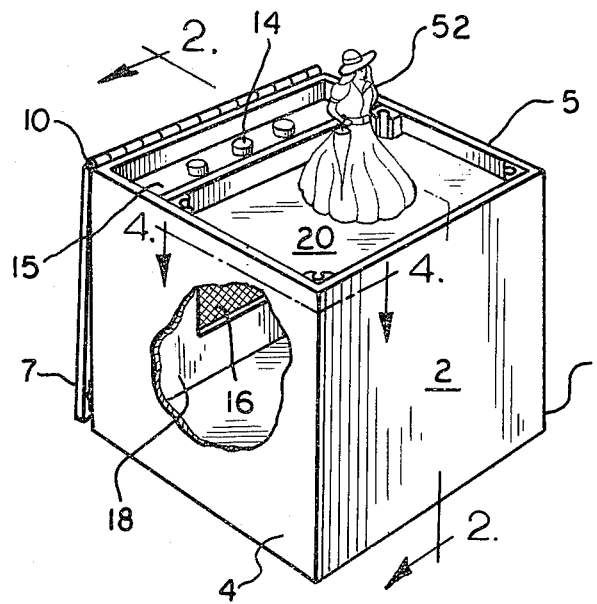
FIG. 1 is a perspective view of my novel housing and platform mounting arrangement.
Figure 2:
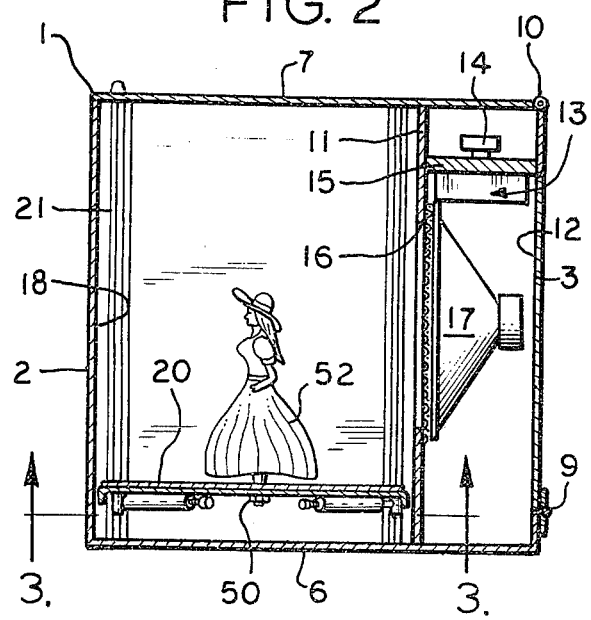
FIG. 2 is a vertical cross-sectional view taken substantially on line 2—2 of FIG. 1.
Figure 4:
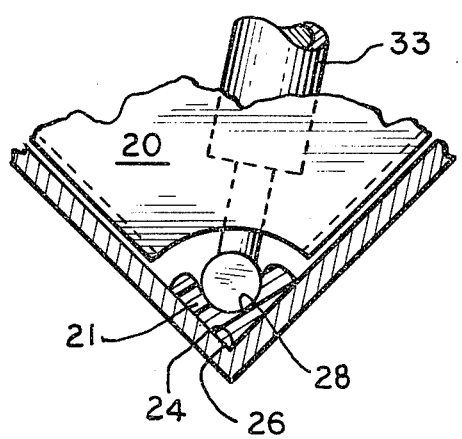
FIG. 4 is an enlarged fragmentary sectional view taken substantially on line 4—4 of FIG. 1.
Figure 3:
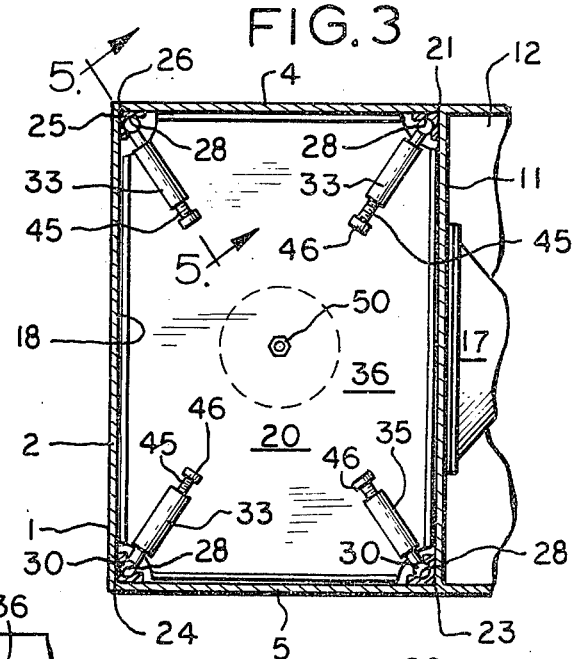
FIG. 3 is a horizontal cross-sectional view taken substantially on line 3—3 of FIG. 2.
Figure 5:
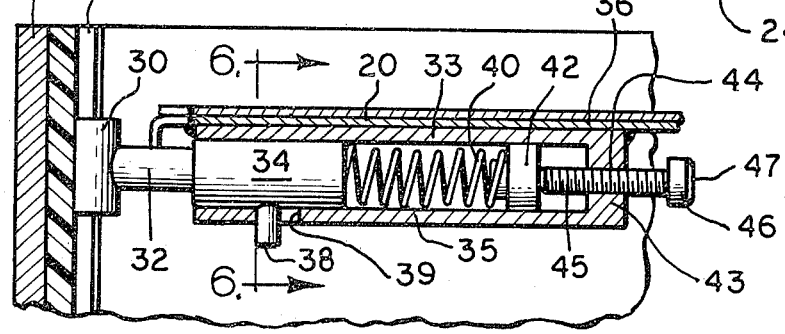
FIG. 5 is an enlarged cross-sectional view taken substantially on line 5—5 of FIG. 3.
Figure 6:
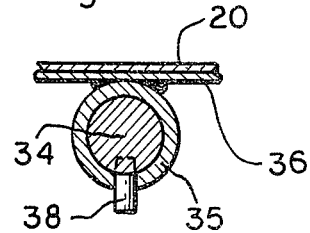
FIG. 6 is a cross-sectional view taken essentially on line 6—6 of FIG. 5.
Figure 7:
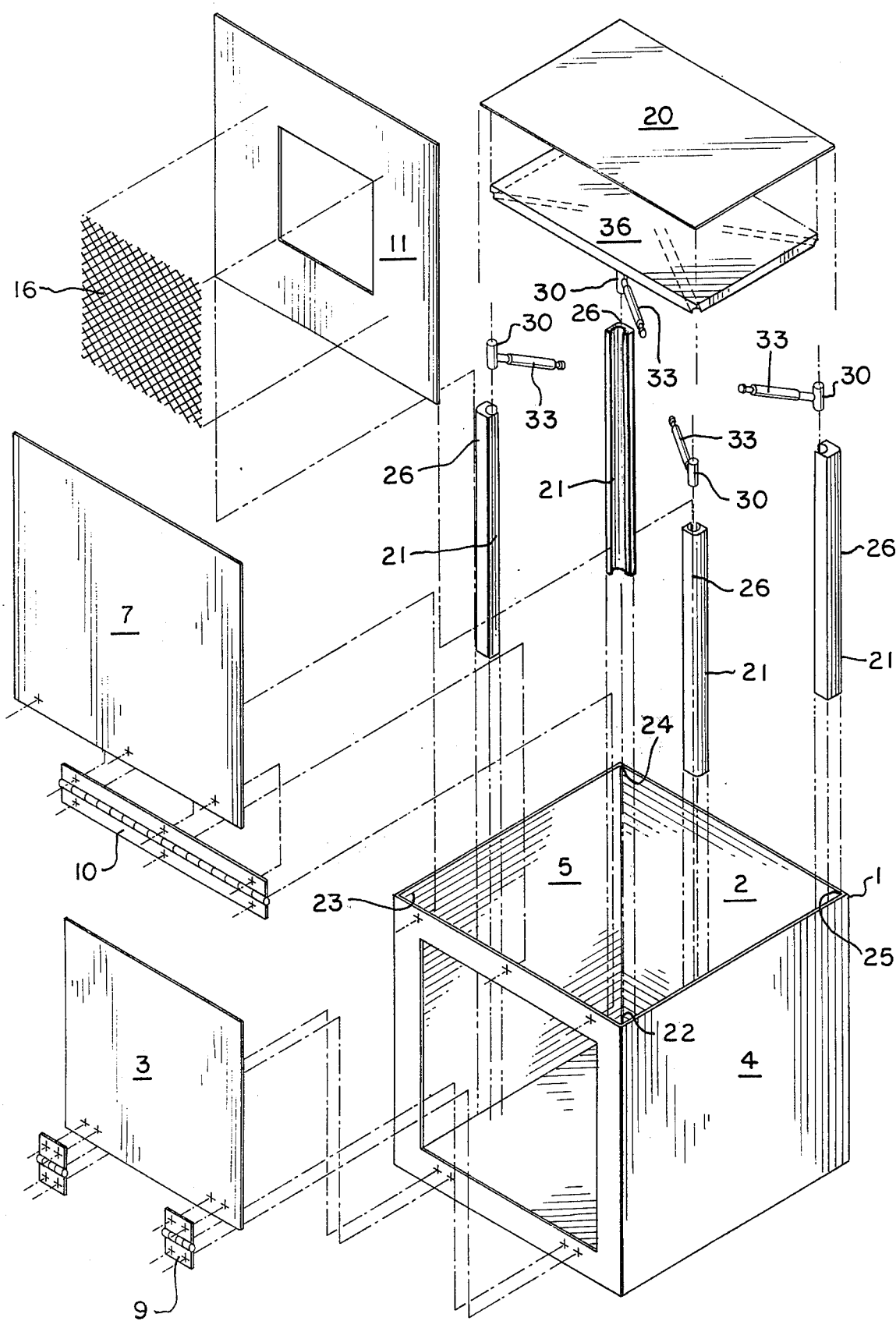
FIG. 7 is an exploded view of the container.

Describing the invention in detail, the container generally designated 1 is a cubical box having front and rear upright walls 2 and 3 and interconnecting side walls 4 and 5, a bottom wall 6 and a top cover 7.

The cover 7 is connected at one of its edges to an adjacent edge of the rear wall by a hinge 10 which permits the cover to be swung open or closed. The rear wall may be hinged at 9 to permit access into the container.

Within the container there is provided a divider in the form of a vertical baffle wall 11 to form with the back wall and portions of the other walls an enclosure 12 for housing an audio system generally designated 13 which includes suitable controls 14 mounted on a panel 15 which is suitably secured to the divider wall 11 and, if necessary, to the other adjacent walls.

The divider wall 11 is provided with a grill covered central opening 16 and a speaker 17 is mounted within the enclosure 12 in alignment with the opening 16 to project sound into the chamber 18 which is defined by the baffle wall 11 and portions of the other walls of the housing.

Within the chamber 18 there is mounted a platform 20 of generally rectangular configuration. The platform is guided vertically by four tracks 21 which are positioned in the corners 22,23,24 and 25 of the chamber 18. Each track is generally V-shaped in cross-section, the apex 26 of which fits into the respective corner and is secured thereto and the interior of the V is formed with a generally semi-circular groove 28. Each track is opposed by an arcuate cut out 29 of the opposing corner of the platform.

A cylindrical friction foot 30 fits within each groove 28, the foot having a generally complimentary contour to the associated groove and being connected to a rod 32 of a plunger 33 which includes a cylindrical bearing 34 which is slidable axially within a tube 35 and in frictional engagement therewith. The tube 35 is suitably fastened as by adhesives to a subplatform 36 which is fastened as by adhesives or otherwise to the platform. The bearing 34 is connected to a radially extending stop 38 which extends through an axial slot 39 which limits the extension of the plunger. The tube 35 encloses a compression spring 40 which reacts at one end against the bearing element and at the other end against a follower 42 which is slidably fitted within the tube 35 which has a closed end wall 43 remote from the plunger. The end wall 43 has a threaded aperture 44 through which there is threaded a shank portion 45 of a bolt 46 which has a head 47. The bolt is adapted to vary the compression of the spring and thus the force under which the friction element engages the track. Also adjustment of the four spring loaded plungers adjusts position of the platform to clear its edges from the sides of the chamber.

The plungers are arranged in pairs diametrically opposite to each other in an array about a common center 50 at which point there is fastened a figurine generally designated 52.

It will become apparent that the platform which is spaced at its edges from the sides of the chamber when elevated to the position in FIG. 1 exposes the figurine and also acts as a baffle or sounding board for declamations and accompanying music effected by the audio system. The figurine is easily stowed by pushing the platform down and exposed by lifting the platform.

It will be readily apparent that a novel, compact and effective unit has been provided in a preferred embodiment. However, various modifications will become apparent which fall within the scope of the appended claims.

I claim:

1. A combination enclosure and display device comprising a container having a bottom and side walls, a wall within the container subdividing the same into an audio system enclosure and a sound chamber, a display platform slidably mounted in said sound chamber and selectively positionable in a lower stowed position at the bottom and in various positions between the top and bottom and in a display position at the top of said chamber, means providing audio communication between said enclosure and said sound chamber, and friction means interposed between said container and platform for holding said platform at selected elevated positions, said platform extending parallel with said bottom and subdividing said chamber horizontally into upper and lower sections in the intermediate positions thereof, and a sound source in said audio system enclosure.

2. The invention according to claim 1 and said friction means each including a vertical track and a spring actuated friction element mounted on the platform and reactive against the track.

3. The invention according to claim 2 and said friction means comprising a friction element engaging the related track, a tubular support mounted on the platform and spring means in the support reacting against the friction element and urging the same against the associated track.

4. The invention according to claim 2 and said friction means being disposed in counterbalancing opposition to each other at opposite ends of the platform.

5. The invention according to claim 1 and a display device mounted on the platform and extending upwardly therefrom in spaced relation to the walls of the container, said platform being spaced at its perimeter from the container walls and said friction means comprising means frictionally resisting movements of the platform transversely of said walls of the container.

6. The invention according to claim 5 and said means for resisting said movement of the platform transversely of said walls, comprising a pair of telescoping elements movable linearly relative to each other, and spring means disposed in opposition to each other at opposite sides of the platform.

7. The invention according to claim 1 and said friction means comprising vertical tracks with semicircular grooves therein, and spring actuated shoes slidably mounted in the grooves, said shoes being of cylindrical shape and elongated lengthwise of the tracks.

8. The invention according to claim 7 and said friction means comprising cylindrical mounting means accommodating relative rotational movements between the shoes and the platform, whereby said platform may be leveled without dislocating the shoes from the respective tracks.

9. The invention according to claim 8 and said platform being of quadrilateral shape and said friction means subtending the corners of the platform.

10. The invention according to claim 9 and said platform movable to an elevated position to form a resonating chamber.

* * * * *